US007871482B2

(12) United States Patent
Choi et al.

(10) Patent No.: US 7,871,482 B2
(45) Date of Patent: Jan. 18, 2011

(54) METHOD OF MANUFACTURING MULTILAYER CERAMIC SUBSTRATE

(75) Inventors: Yong Seok Choi, Suwon (KR); Seung Gyo Jeong, Hwaseong (KR); Eun Tae Park, Yongin (KR); Ki Pyo Hong, Yongin (KR); Soo Hyun Lyoo, Yongin (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 12/476,538

(22) Filed: Jun. 2, 2009

(65) Prior Publication Data
US 2010/0101702 A1    Apr. 29, 2010

(30) Foreign Application Priority Data
Oct. 28, 2008    (KR)    ...................... 10-2008-0106189

(51) Int. Cl.
*C03B 29/00*    (2006.01)
*B23B 33/00*    (2006.01)
*A63B 39/00*    (2006.01)
*B29C 65/00*    (2006.01)
*B65C 9/25*    (2006.01)

(52) U.S. Cl. .................... 156/89.12; 156/89.11; 156/90; 156/145; 156/152; 156/154; 156/182; 156/297; 156/322

(58) Field of Classification Search .............. 156/89.11, 156/89.12
See application file for complete search history.

(56) References Cited

U.S. PATENT DOCUMENTS

| | | | | | |
|---|---|---|---|---|---|
| 5,195,019 | A | * | 3/1993 | Hertz | .......................... 361/328 |
| 5,384,434 | A | * | 1/1995 | Mandai et al. | .............. 174/258 |
| 5,455,385 | A | * | 10/1995 | Newton et al. | .............. 174/559 |
| 5,476,728 | A | * | 12/1995 | Nakano et al. | .............. 428/815 |
| 5,769,987 | A | * | 6/1998 | Gurkovich et al. | ........ 156/89.12 |
| 6,094,111 | A | * | 7/2000 | Sunahara | ..................... 333/184 |
| 6,517,924 | B1 | * | 2/2003 | Kameda et al. | ............. 428/138 |
| 6,717,794 | B2 | * | 4/2004 | Yoshikawa et al. | ........ 361/321.2 |
| 2001/0022237 | A1 | * | 9/2001 | Suzuki et al. | ............... 174/256 |
| 2002/0118519 | A1 | * | 8/2002 | Umemoto et al. | ........... 361/748 |
| 2003/0094307 | A1 | * | 5/2003 | Saito et al. | ................... 174/262 |
| 2003/0159770 | A1 | * | 8/2003 | Kameda et al. | .......... 156/89.11 |
| 2003/0201055 | A1 | * | 10/2003 | Cho | ......................... 156/89.11 |
| 2006/0021691 | A1 | * | 2/2006 | Sakurai et al. | ........... 156/89.11 |
| 2006/0035071 | A1 | * | 2/2006 | Ishiyama et al. | ............. 428/325 |
| 2006/0075782 | A1 | * | 4/2006 | Watanabe et al. | .............. 65/42 |

FOREIGN PATENT DOCUMENTS

KR    10-2005-0058668 A    6/2005

\* cited by examiner

*Primary Examiner*—Philip C Tucker
*Assistant Examiner*—Alex Efta
(74) *Attorney, Agent, or Firm*—McDermott Will & Emery LLP

(57) ABSTRACT

Disclosed is a method of manufacturing a multilayer ceramic substrate. The method includes providing a plurality of ceramic blocks, each including a ceramic laminate having a first surface and a second surface and having a laminated structure of a plurality of ceramic green sheets containing a glass ceramic component, and a first bonding ceramic green sheet including a glass component and disposed on a surface of the first and second surfaces of the ceramic laminate, which is to contact another ceramic laminate, firing the plurality of ceramic blocks, laminating the plurality of fired ceramic blocks such that the first bonding ceramic green sheets of the adjacent ceramic blocks face each other, and bonding the plurality of ceramic blocks using the glass component of the first bonding ceramic green sheets.

12 Claims, 9 Drawing Sheets

METHOD OF MANUFACTURING MULTILAYER CERAMIC SUBSTRATE

CROSS-REFERENCE TO RELATED APPLICATIONS

This application claims the priority of Korean Patent Application No. 2008-0106189 filed on Oct. 28, 2008, in the Korean Intellectual Property Office, the disclosure of which is incorporated herein by reference.

BACKGROUND OF THE INVENTION

1. Field of the Invention

The present invention relates to a method of manufacturing a multilayer ceramic substrate, and more particularly, to a method of manufacturing a multilayer ceramic substrate, which includes the bonding of a plurality of ceramic blocks.

2. Description of the Related Art

In general, semiconductor devices are subject to a large number of processes in order to perform their operations as one complete semiconductor package. Specifically, these processes may include semiconductor wafer production, fabrication (FAB) and assembly.

A plurality of semiconductor devices are formed on a wafer by FAB, and then electrical die sorting (EDS) is performed on the plurality of semiconductor devices to sort out defective semiconductor devices. Equipment used for EDS includes a taster and a probe station. A probe card is installed at the probe station, and mechanically contacts an electrode pad of a semiconductor device on a wafer.

In general, the probe card may be manufactured corresponding to the size of the semiconductor wafer which is to be tested. In this case, the probe card may be about 8 inches to 12 inches in size, and needs to have high strength. The probe card may be manufactured using a multilayer ceramic substrate.

The multilayer ceramic substrate may be formed using the process of firing a ceramic laminate from a plurality of ceramic green sheets. In this case, the ceramic laminate includes tens to millions of interlayer circuits such as internal electrodes and via electrodes. However, the interlayer circuits have low location precision because they are displaced or deformed as the ceramic laminate shrinks when fired.

To solve this low location precision, a constraining layer may be disposed on the top and/or bottom of the ceramic laminate in order to suppress shrinkage in the plane direction. However, despite the constraining layer, the ceramic laminate, having a thickness of 5 mm or greater, still shrinks in the plane direction, causing the interlayer circuits to become deformed and displaced.

SUMMARY OF THE INVENTION

An aspect of the present invention provides a method of manufacturing a multilayer ceramic substrate, which can improve the location precision of interlayer circuits by firing a plurality of ceramic blocks and then bonding the fired ceramic blocks.

Another aspect of the present invention provides a method of manufacturing a multilayer ceramic substrate, which can enhance the bonding force between a plurality of ceramic blocks by bonding the ceramic blocks using a binder layer or a bonding ceramic green sheet containing the glass component.

According to an aspect of the present invention, there is provided a method of manufacturing a multilayer ceramic substrate, including: providing a plurality of ceramic blocks, each including a ceramic laminate having a first surface and a second surface and having a laminated structure of a plurality of ceramic green sheets containing a glass ceramic component, and a first bonding ceramic green sheet including a glass component and disposed on a surface of the first and second surfaces of the ceramic laminate, which is to contact another ceramic laminate; firing the plurality of ceramic blocks; laminating the plurality of fired ceramic blocks such that the first bonding ceramic green sheets of the adjacent ceramic blocks face each other; and bonding the plurality of ceramic blocks using the glass component of the first bonding ceramic green sheets.

The bonding of the plurality of ceramic blocks may include melting the glass component of the first bonding ceramic green sheet by heating the plurality of laminated ceramic blocks, to bond the plurality of ceramic blocks together.

The glass ceramic component may generate $CaAl_2Si_2O_8$, $SrAl_2Si_2O_8$, $BaAl_2Si_2O_8$ or $CaMgSi_2O_6$ when sintered. The glass component may be $SiO_2$-based glass. The $SiO_2$-based glass may include $SiO_2$—$MgO$—$Al_2O_3$, $SiO_2$—$Al_2O_3$, $SiO_2$—$Al_2O_3$—$CaO$, $SiO_2$—$Al_2O_3$—$BaO$, or $SiO_2$—$CaO$.

The plurality of ceramic blocks may each have a thickness of 2 mm or less.

The firing of the plurality of ceramic blocks may include: forming a constraining layer on at least one of opposing surfaces of each of the plurality of ceramic blocks; firing each ceramic block including the constraining layer; and removing the constraining layer from each ceramic block.

The laminating of the plurality of fired ceramic blocks may include laminating the plurality of fired ceramic blocks such that second bonding ceramic green sheets containing a glass component are placed between facing ceramic blocks of the plurality of fired ceramic blocks, respectively. The glass component of the first bonding ceramic green sheet and the glass component of the second bonding ceramic green sheet may be the same material.

The second bonding ceramic green sheets may each have a thickness ranging from 30 μm to 100 μm. The plurality of ceramic blocks may each include an interlayer circuit, and the second bonding ceramic green sheets may each further include a conductive via to be connected with the interlayer circuit of the adjacent ceramic block.

The second bonding ceramic green sheet may further include a binder layer on a top surface and a bottom surface thereof, the binder layer including a binder resin and a solvent.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1A:
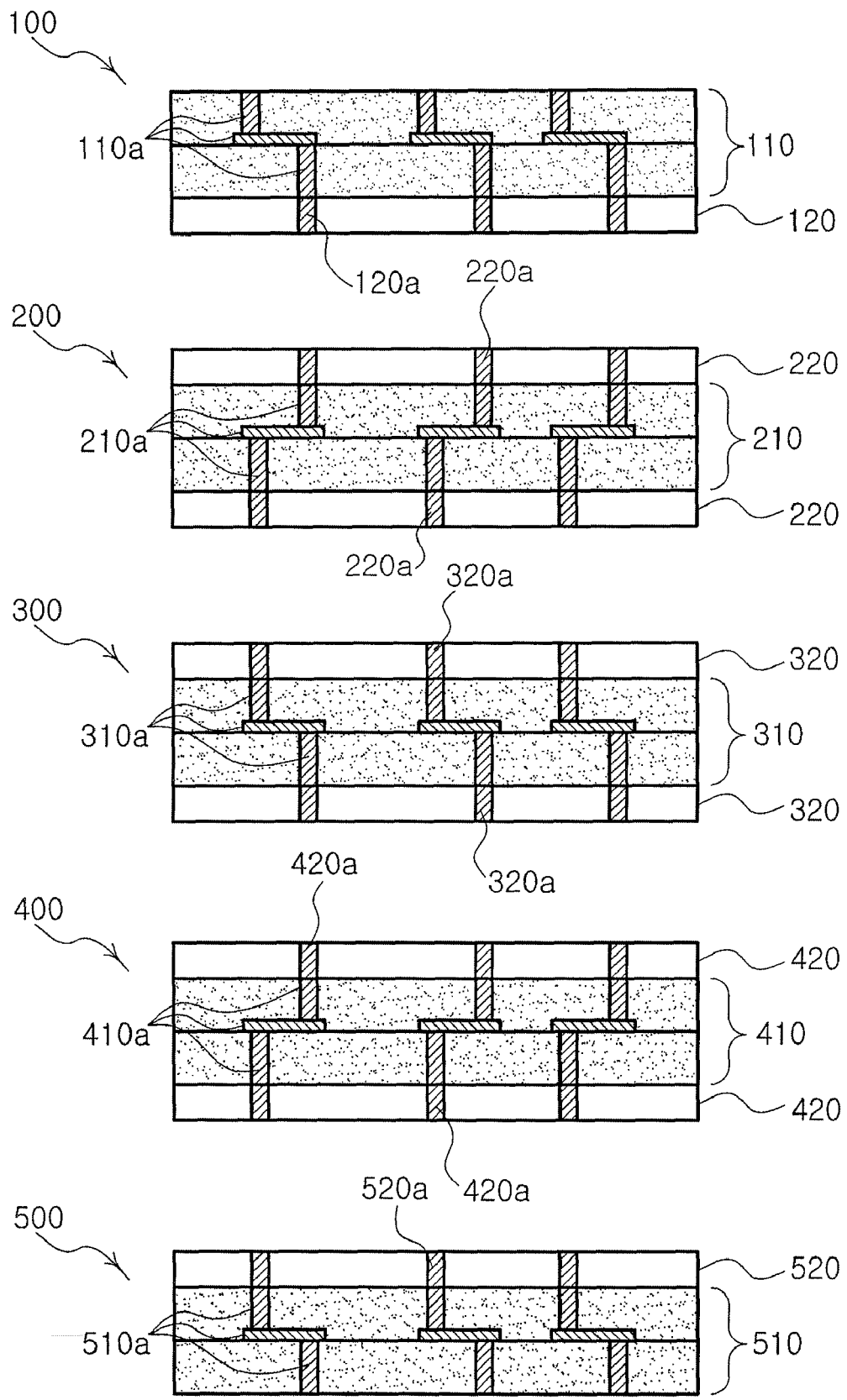
FIGS. 1A and 1B are views for explaining a method of manufacturing a multilayer ceramic substrate, according to an exemplary embodiment of the present invention.
Figure 1B:
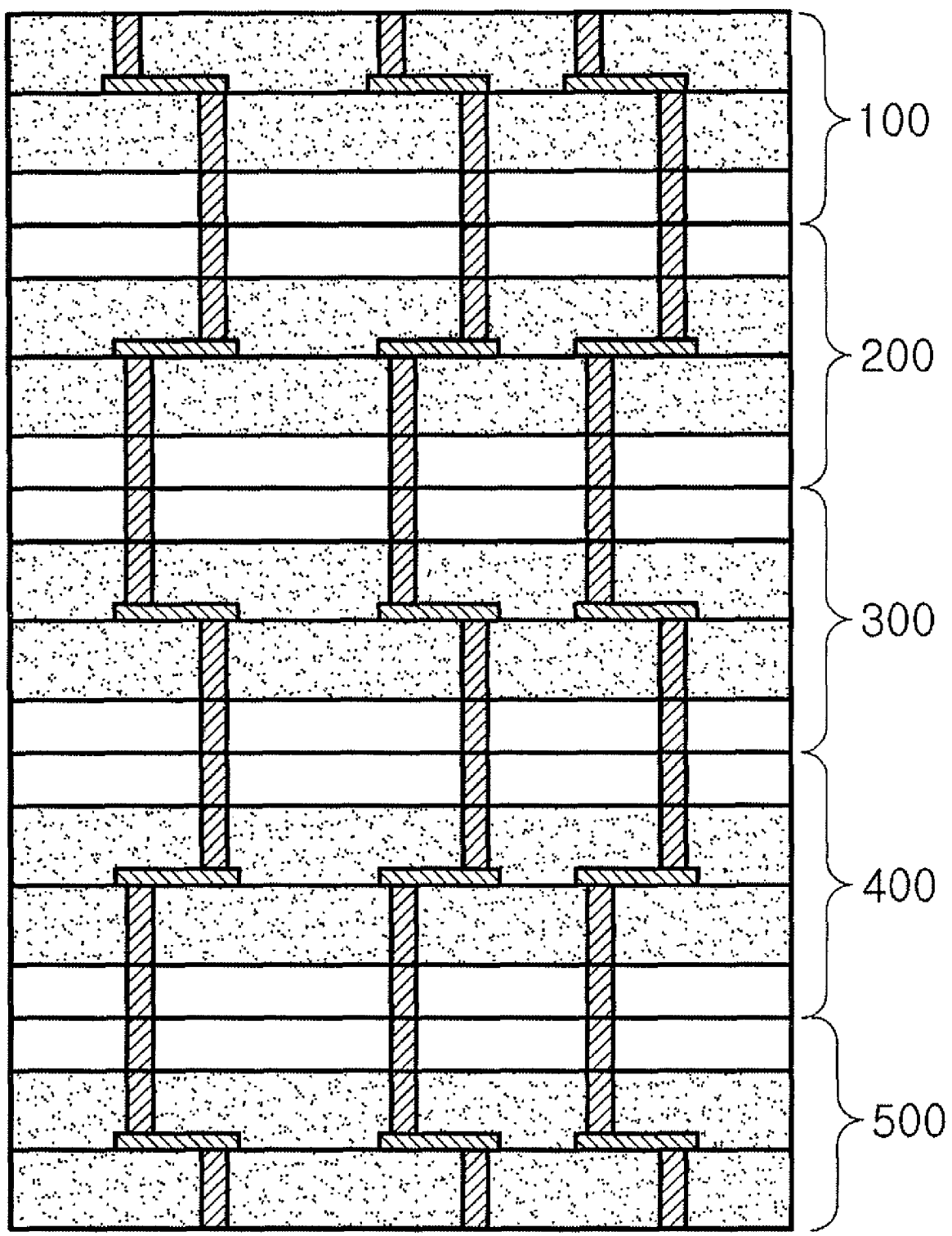

FIGS. 1A and 1B are views for explaining a method of manufacturing a multilayer ceramic substrate, according to an exemplary embodiment of the present invention. Referring to FIG. 1A, a plurality of ceramic blocks 100, 200, 300, 400 and 500 are manufactured. Each of the ceramic blocks 100, 200, 300, 400 and 500 includes a ceramic laminate and a first bonding ceramic green sheet. Hereinafter, the ceramic blocks 100, 200, 300, 400 and 500 are also referred to as first to fifth ceramic blocks 100, 200, 300, 400 and 500, respectively.

Specifically, the first ceramic block 100 includes a ceramic laminate 110 and a first bonding ceramic green sheet 120. In this case, the ceramic laminate 110 may include a plurality of ceramic green sheets. A first bonding ceramic green sheet 120 is disposed on one of first and second surfaces of the ceramic laminate 110 which is to contact another ceramic block. In the case of the first ceramic block 100, which is the uppermost block in FIG. 1A, only the second surface, that is, the bottom surface contacts another ceramic laminate. Thus, the first bonding ceramic green sheet 120 may be bonded only to the second surface of the first ceramic block 100.

The first ceramic block 100 includes interlayer circuits 110a and 120a used as electrical signal lines. The interlayer circuits 110a and 120a may include a conductive via and an internal electrode in the ceramic laminate 110, and a conductive via in the first bonding ceramic green sheet 120. In this case, the conductive via in the first bonding ceramic green sheet 120 may be placed in a position corresponding to that of the interlayer circuit exposed through the second surface of the ceramic laminate 110.

The second ceramic block 200 includes a ceramic laminate 210, first bonding ceramic green sheets 220, and interlayer circuits 210a and 220a. The second ceramic block 200 contacts the first and third ceramic blocks 100 and 300. Thus, the first bonding ceramic green sheets 220 may be bonded with both the first and second surfaces of the ceramic laminate 210, respectively.

The third ceramic block 300 includes a ceramic laminate 310, first bonding ceramic green sheets 320, and interlayer circuits 310a and 320a. The third ceramic block 300 contacts the second and fourth ceramic blocks 200 and 400. Thus, the first bonding ceramic green sheets 320 may be bonded with both the first and second surfaces of the ceramic laminate 310, respectively.

The fourth ceramic block 400 includes a ceramic laminate 410, first bonding ceramic green sheets 420, and interlayer circuits 410a and 420a. The fourth ceramic block 400 contacts the third and fifth ceramic blocks 300 and 500. Thus, the first bonding ceramic green sheets 420 may be bonded with both the first and second surfaces of the ceramic laminate 410, respectively.

The fifth ceramic block 500 includes a ceramic laminate 510, a first bonding ceramic green sheet 520, and interlayer circuits 510a and 520a. The fifth ceramic block 500 is the lowermost block, and thus contacts just the fourth ceramic block 400 from the first surface of the ceramic laminate 510, that is, its top surface. Thus, only the first bonding ceramic green sheet 520 may be bonded with the first surface of the ceramic laminate 510.

The ceramic laminate constituting each of the first to fifth ceramic blocks 100, 200, 300, 400 and 500 includes a plurality of ceramic green sheets. In this case, the plurality of ceramic green sheets are formed by applying and drying a slurry obtained by mixing a glass ceramic component, a ceramic component, an organic binder, a mixing solvent and the like. Notably, the plurality of ceramic green sheets contain the glass ceramic component. The glass ceramics are general low-temperature fired glass components and refer glass components that are crystallized at a firing temperature of corresponding ceramics. As the glass ceramics, a material, generating a material such as $CaAl_2Si_2O_8$, $SrAl_2Si_2O_8$, $BaAl_2Si_2O_8$ or $CaMgSi_2O_6$ when fired, may be used.

The first bonding ceramic green sheets 120, 220, 320, 420 and 520 are each formed by applying and drying a slurry obtained by mixing a glass component, a ceramic component, an organic binder, a mixing solvent and the like. The first bonding ceramic green sheets 120, 220, 320, 420 and 520, manufactured as described above, are each disposed on at least one of the first and second surfaces of the ceramic laminates 110, 210, 310, 410 and 510, respectively, thereby forming the first to fifth ceramic bocks 100, 200, 300, 400 and 500. In this case, each of the first bonding ceramic green sheets 120, 220, 320, 420 and 520 contains a glass component which is different from the glass component of the ceramic laminates 110, 210, 310, 410 and 510.

The glass component of the bonding ceramic green sheets 120, 220, 320, 420 and 520 refers to a glass that is not crystallized at the firing temperature of the corresponding ceramics, unlike the glass ceramics, or can provide relatively high bonding strength upon receiving energy such as heat after the firing process, because of its lower degree of crystallization compared to the general low-temperature fired glass component. The glass having the aforementioned property may include, for example, a $SiO_2$-based glass material. In this case, the $SiO_2$-based glass material may be $SiO_2$—$MgO$—$Al_2O_3$, $SiO_2$—$Al_2O_3$, $SiO_2$—$Al_2O_3$—$CaO$, $SiO_2$—$Al_2O_3$—$BaO$, $SiO_2$—$CaO$ or the like.

The first to fifth ceramic blocks 100, 200, 300, 400 and 500, each including two ceramic green sheets, are described and illustrated in FIG. 1A. However, the present invention is not limited to the embodiment described above, and the first to fifth ceramic blocks 100, 200, 300, 400 and 500 maybe designed to include three or more ceramic green sheets if each of the ceramic blocks does not exceed 2 mm in thickness.

Figure 2:
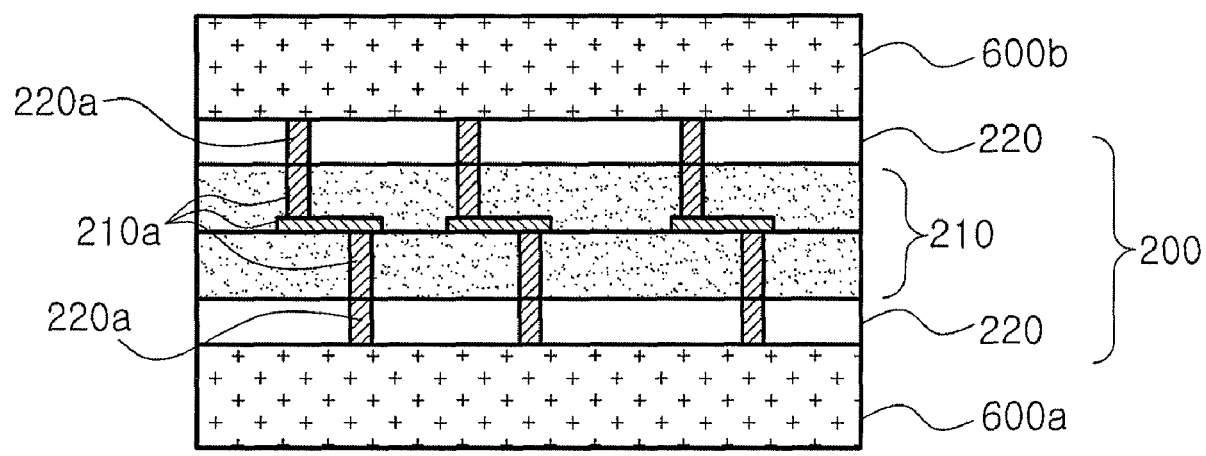
FIG. 2 is a view for explaining a method of firing a ceramic block as illustrated in FIG. 1A.

Thereafter, the first to fifth ceramic blocks 100, 200, 300, 400 and 500 illustrated in FIG. 1A are individually fired. The firing method will now be described in more detail with reference to FIG. 2. FIG. 2 is a view for explaining a method of firing the ceramic blocks 100, 200, 300, 400 and 500 of FIG. 1A.

The ceramic block illustrated in FIG. 2 is the second ceramic block 200. The firing method will now be described using the second ceramic block 200 as an example. Specifically, constraining layers 600a and 600b are disposed on the bottom and top surfaces of the second ceramic block 200, respectively. In this case, the firing temperature of the second ceramic block 200 may range from about 600° C. to 900° C., and the firing temperature of the constraining layers 600a and 600b may be higher than that of the second ceramic block 200, and may be about 1000° C. or higher. Materials meeting the above condition may include alumina $Al_2O_3$ and zirconia $ZrO_2$.

Thereafter, the second ceramic block 200, where the constraining layers 600a and 600b are formed, is fired at a temperature ranging from about 700° C. to 900° C. While the constraining layers 600a and 600b suppress the shrinkage of the second ceramic block 200 in the plane direction, the second ceramic block 200 shrinks in the thickness direction. The second ceramic block 200 with a thickness of 2 mm or less has a high shrinkage suppressing rate during the firing process, thereby preventing the interlayer circuits 210a and 220a in the second ceramic block 200 from being significantly displaced. The second ceramic block 200, after firing, may have a thickness of 1.5 mm or less because of the shrinkage in the thickness direction, which has occurred in the firing process.

In the firing process illustrated in FIG. 2, the glass ceramic component contained in the ceramic laminate 210 of the second ceramic block 200 is crystallized. Also, the glass component contained in the first bonding ceramic green sheets 220 is melted. When the second ceramic block 200 is cooled after firing, the melted glass component is solidified.

After the second ceramic block 200 is fired using the method illustrated in FIG. 2, the constraining layers 600a and 600b are removed from the second ceramic block 200. The constraining layers 600a and 600b may be removed through a polishing method such as sand blasting.

The description regarding FIG. 2 has been made using the second ceramic block 200 as an example. However, the first ceramic block 100 and the third to fifth ceramic blocks 300, 400 and 500 illustrated in FIG. 1A may also be fired in the same manner as the second ceramic block 200.

Thereafter, after the first to fifth ceramic blocks 100, 200, 300, 400 and 500 are fired using the method illustrated in FIG. 2, the first to fifth ceramic blocks 100, 200, 300, 400 and 500 are bonded together by the use of the first bonding ceramic green sheets 120, 220, 320, 420 and 520 as shown in FIG. 1B.

In detail, the first to fifth ceramic blocks 100, 200, 300, 400 and 500 are laminated with corresponding sheets of the first bonding ceramic green sheets 120, 220, 320, 420 and 520 opposing each other. Thereafter, by heating the resultant laminate, the first to fifth ceramic blocks 100, 200, 300, 400 and 500 are bonded together. In detail, the glass components contained in the first bonding ceramic green sheets 120, 220, 320, 420 and 520 are melted by heat and joined to each other at each interface between the facing ceramic blocks. In this state, the heat is removed from the first to fifth ceramic blocks 100, 200, 300, 400 and 500 to solidify the glass components contained in the first bonding ceramic green sheets 120, 220, 320, 420, 520 again, thereby bonding the first to fifth ceramic blocks 100, 200, 300, 400 and 500 together. The previously fired first to fifth ceramic blocks 100, 200, 300, 400 and 500 are bonded together using the above process, thereby manufacturing a multilayer ceramic substrate.

As described above, the first to fifth ceramic blocks 100, 200, 300, 400 and 500, each having a thickness of 2 mm or less, are fired and then bonded, thereby reducing the displacement or deformation of the interlayer circuits disposed in the first to fifth ceramic blocks 100, 200, 300, 400 and 500.

Also, the strength of the ceramic laminates 110, 210, 310, 410 and 510 can be enhanced because the glass ceramic components of each of the ceramic laminates 110, 210, 310, 410 and 510 are crystallized in the firing process. In this case, the strength of each of the ceramic laminates 110, 210, 310, 410 and 510 affects the strength of a corresponding ceramic block of the ceramic blocks 100, 200, 300, 400 and 500. The bonding of the ceramic blocks 100, 200, 300, 400 and 500 may also enhance the strength of the manufactured multilayer ceramic substrate. Accordingly, the multilayer ceramic substrate, when used in a probe card, can satisfy the strength requirements of a probe card.

The respective first bonding ceramic green sheets 120 on the first to fifth ceramic blocks 100, 200, 300, 400 and 500 facilitate the bonding of the first to fifth ceramic blocks 100, 200, 300, 400 and 500.

Figure 3A:
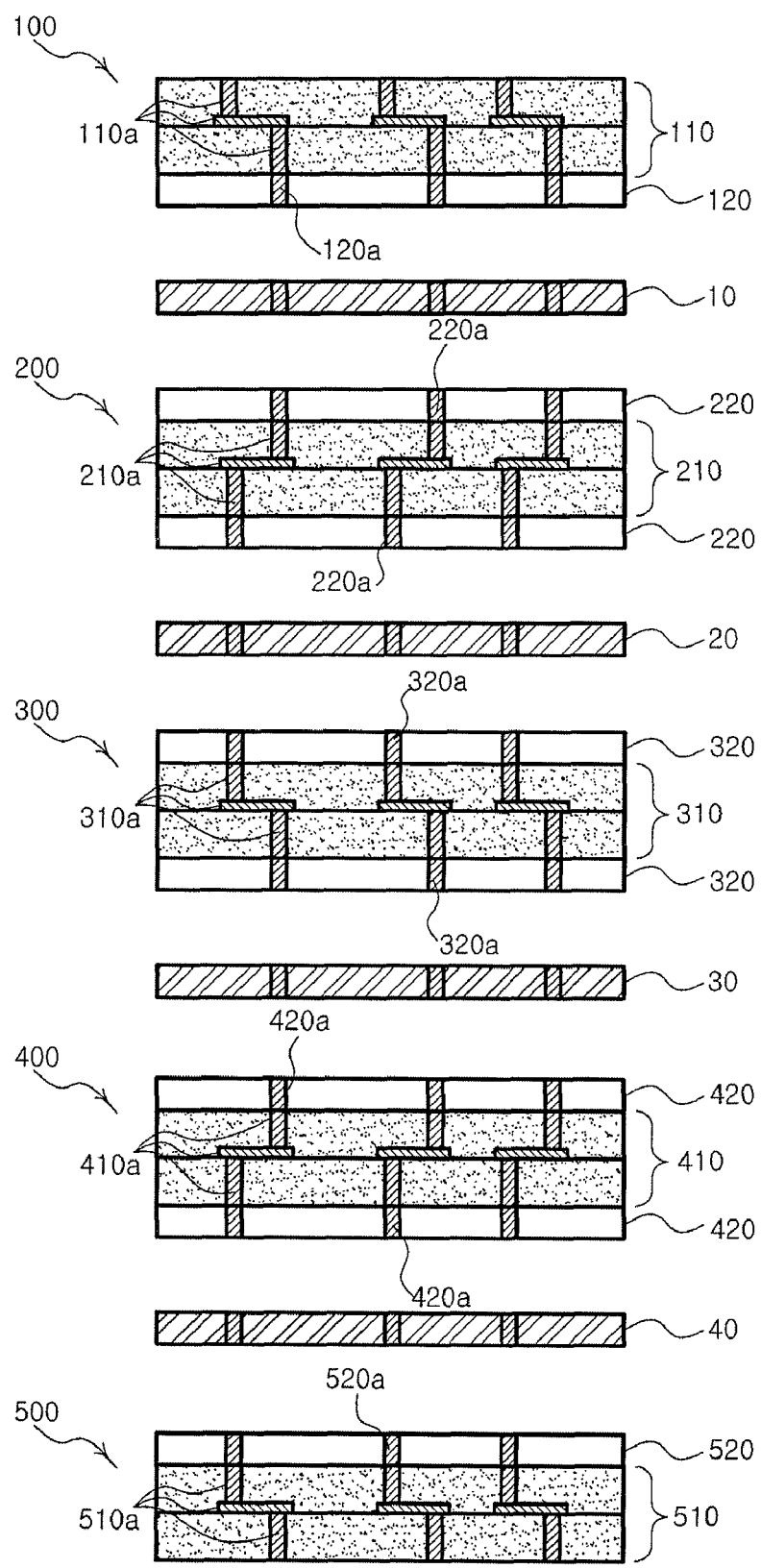
FIGS. 3A and 3B are views for explaining a method of manufacturing a multilayer ceramic substrate, according to another exemplary embodiment of the present invention.
Figure 3B:
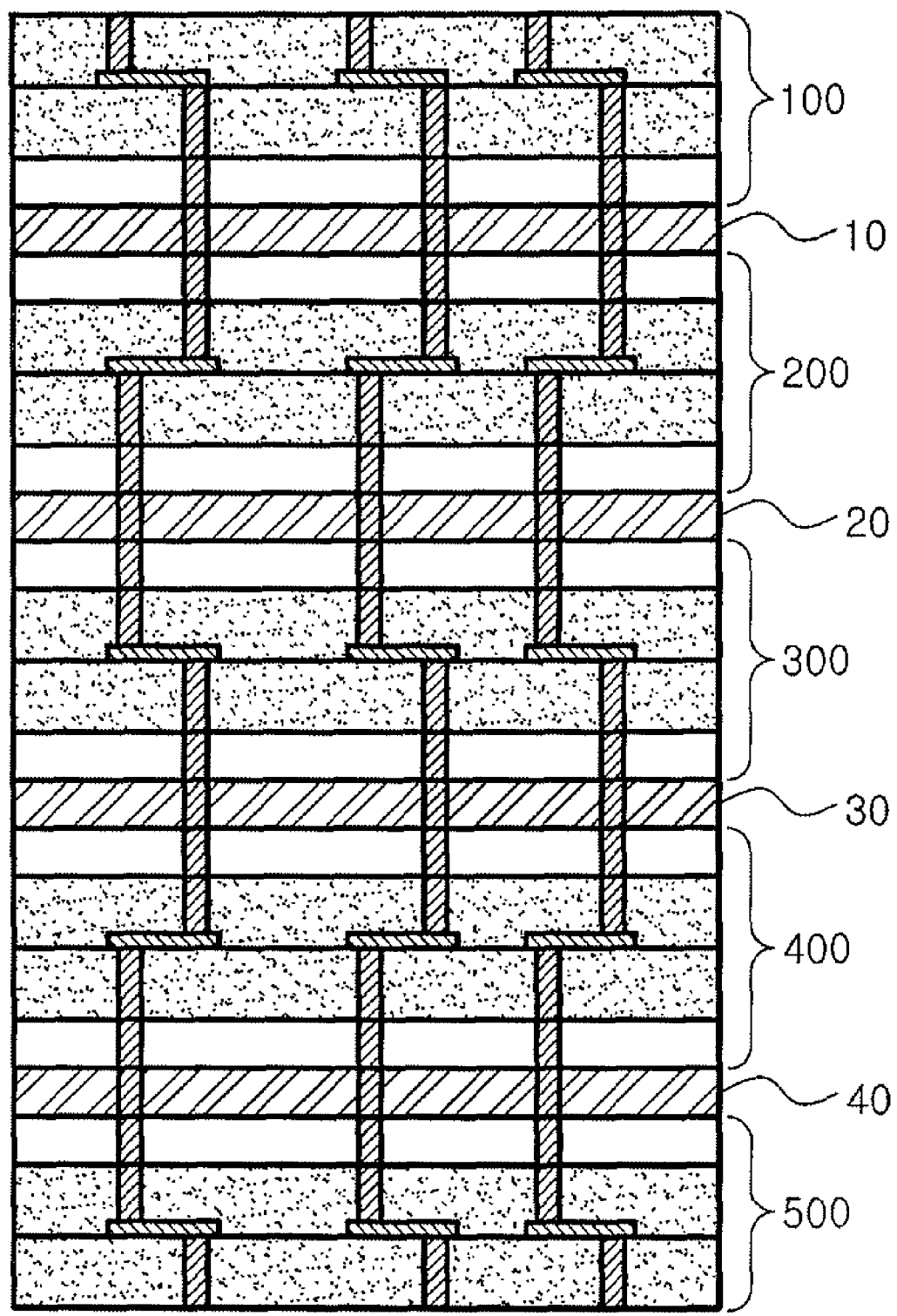

FIGS. 3A and 3B are views for explaining a method of manufacturing a multilayer ceramic substrate, according to another exemplary embodiment of the present invention. Referring to FIG. 3A, the first to fifth ceramic blocks 100, 200, 300, 400 and 500 are the same as those illustrated in FIG. 1A. The first to fifth ceramic blocks 100, 200, 300, 400 and 500 may be fired individually by the method described above with reference to FIG. 2.

The ceramic blocks may be bonded by second bonding ceramic green sheets. Referring to FIG. 3A, a second bonding ceramic green sheet 10 is placed between the first ceramic block 100 and the second ceramic block 200.

Like the second bonding ceramic green sheet 10, other second bonding ceramic green sheets 20, 30 and 40 are disposed between the second and third ceramic blocks 200 and 300, the third and fourth ceramic blocks 300 and 400, and the fourth and fifth ceramic blocks 400 and 500, respectively. Accordingly, each of the second bonding ceramic bocks sheets 10, 20, 30 and 40 face at least one corresponding sheet of the first bonding ceramic green sheets 120, 220, 320, 420 and 520 of the first to fifth ceramic blocks 100, 200, 300, 400 and 500, respectively.

The second bonding ceramic green sheets 10, 20, 30 and 40 may be formed by applying and drying a slurry obtained by mixing a glass component, a ceramic component, an organic binder, a mixing solvent and the like. In this case, the second bonding ceramic green sheets 10, 20, 30 and 40 may be formed of the same material as the first bonding ceramic green sheets 120, 220, 320, 420 and 520, and notably, may contain the same glass component.

Thereafter, bonding is performed on the first to fifth ceramic blocks 100, 200, 300, 400 and 500 and the second bonding ceramic green sheets 10, 20, 30 and 40. Specifically, the first to fifth ceramic blocks 100, 200, 300, 400 and 500, laminated interleaved with the second bonding ceramic green sheets 10, 20, 30 and 40, are heated. The heat melts the glass components contained in the respective first bonding ceramic green sheets 120, 220, 320, 420, 520 in the first to fifth ceramic blocks 100, 200, 300, 400 and 500 and the glass components in the second bonding ceramic green sheets 10, 20, 30 and 40. Accordingly, the melted glass components are joined to each other at the interface between each facing set of the first bonding ceramic green sheets 120, 220, 320, 420 or 520 and the second bonding ceramic green sheets 10, 20, 30 and 40. If the glass components of the first bonding ceramic green sheets 120, 220, 320, 420 and 520 are identical to those of the second bonding ceramic green sheets 10, 20, 30 and 40, the glass components melted at the interface therebetween can be more easily joined to each other.

In this state, when the heat applied to the first to fifth ceramic blocks 100, 200, 300, 400 and 500 is removed, the glass components in the first bonding ceramic green sheets 120, 220, 320, 420 and 520 and the glass components in second bonding ceramic green sheets 10, 20, 30 and 40 are solidified again, bonding the first to fifth ceramic blocks 100, 200, 300, 400 and 500 together. Through the process described above, the previously fired first to fifth ceramic blocks 100, 200, 300, 400 and 500 are bonded, thereby manufacturing a multilayer ceramic substrate.

Figure 4A:
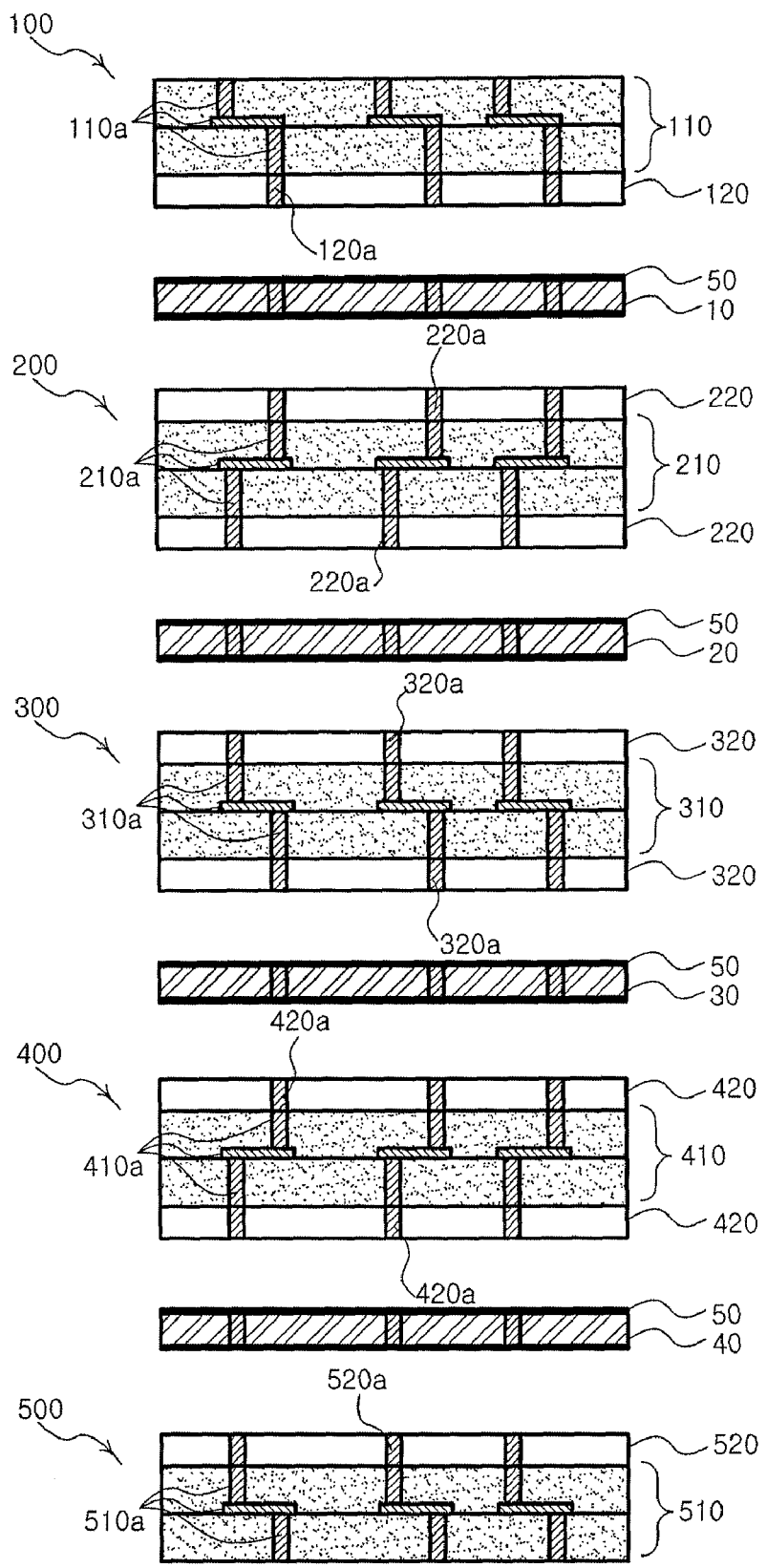
FIGS. 4A and 4B are views for explaining a method of manufacturing a multilayer ceramic substrate, according to another exemplary embodiment of the present invention.
Figure 4B:
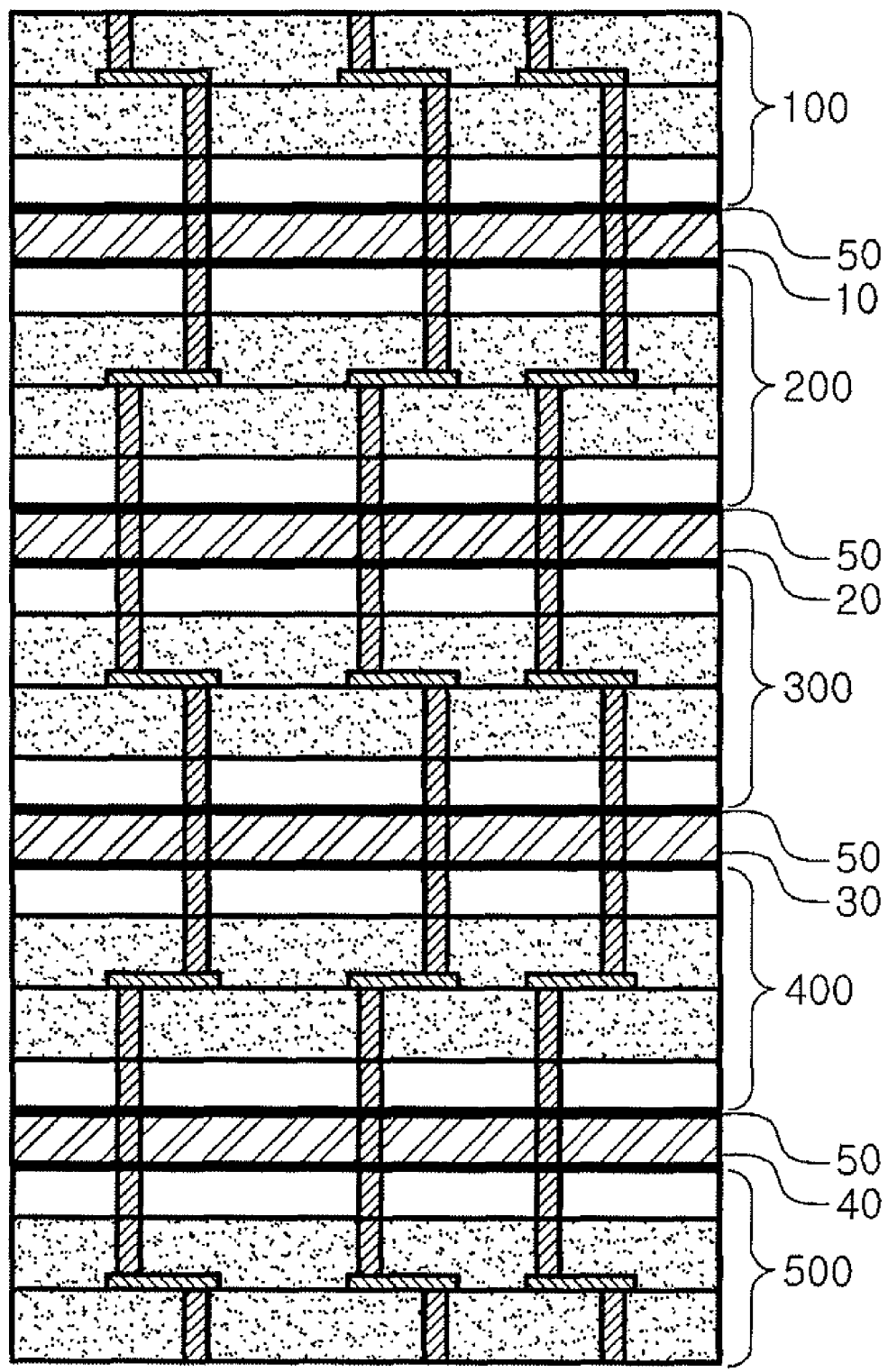

FIGS. 4A and 4B are views for explaining a method of manufacturing a multilayer ceramic substrate, according to another exemplary embodiment of the present invention. Referring to FIG. 4A, the first to fifth ceramic blocks 100, 200, 300, 400 and 500 are the same as those illustrated in FIG. 1A. Also, the first to fifth ceramic blocks 100, 200, 300, 400 and 500 may be fired individually using the method illustrated in FIG. 2.

Referring to FIG. 4A, the second bonding ceramic green sheets 10, 20, 30 and 40 are placed between the first and second ceramic blocks 100 and 200, the second and third ceramic blocks 200 and 300, the third and fourth ceramic blocks 300 and 400, and the fourth and fifth ceramic bocks 400 and 500, respectively. The second bonding ceramic green sheets 10, 20, 30 and 40 are the same as those illustrated in FIG. 3A.

However, the second bonding ceramic green sheets 10, 20, 30 and 40, illustrated in FIG. 4A, each further include one or more binder layers 50 disposed on the top, bottom or both surfaces thereof. The binder layers 50 serve to enhance the interlay bonding force of the first to fifth ceramic blocks 100, 200, 300, 400 and 500. To this end, the binder layers 50 may be formed of a mixture of a binder resin and a solvent, and materials having high melting properties may be used.

Thereafter, as shown in FIG. 4B, the first to fifth ceramic blocks 100, 200, 300, 400 and 500, laminated interleaved with the second bonding ceramic green sheets 10, 20, 30, 40 and the binder layers 50, are heated. The heat melts the glass components contained in the respective first bonding ceramic green sheets 120, 220, 320, 420 and 520 in the first to fifth ceramic blocks 100, 200, 300, 400 and 500, and the glass components in the second bonding ceramic green sheets 10, 20, 30 and 40. The heat also melts the material contained in the binder layers 50. Accordingly, the binder layer 50 increases the extent to which the melted glass components are joined to each other at the interface between each facing set of the first bonding ceramic green sheets 120, 220, 320, 420 and 520 and the second bonding ceramic green sheets 10, 20, 30 and 40.

In this state, the heat applied to the first to fifth ceramic blocks 100, 200, 300, 400 and 500 is removed to re-solidify the binder layers 50 and the glass components contained in the first bonding ceramic green sheets 120, 220, 320, 420 and 520 and the glass components in the second bonding ceramic green sheets 10, 20, 30 and 40. Consequently, the first to fifth ceramic blocks 100, 200, 300, 400 and 500 are bonded together. By the process described above, the previously fired first to fifth ceramic blocks 100, 200, 300, 400 and 500 are bonded together, thereby manufacturing a multilayer ceramic substrate.

Figure 5A:
FIGS. 5A through 5C are views for explaining a method of manufacturing a second bonding ceramic green sheet illustrated in FIG. 3A.
Figure 5B:
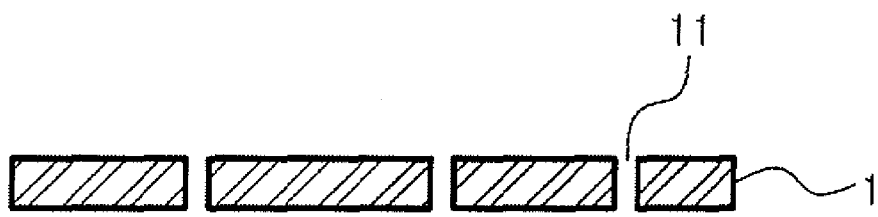
Figure 5C:
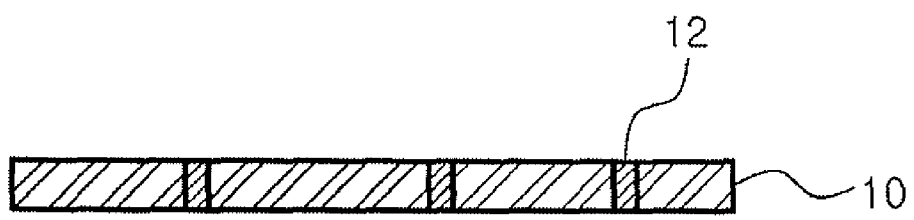

FIGS. 5A through 5C are views for explaining a method of manufacturing the second bonding ceramic green sheet illustrated in FIG. 3A. First, referring to FIG. 5A, a ceramic green sheet 1 for bonding is provided. The ceramic green sheet 1 may be prepared by mixing a glass component, a ceramic component, a binder, a mixing solvent and the like to produce a slurry, and applying and drying the slurry. In this case, the ceramic green sheet 1 may be prepared with a thickness ranging from about 30 μm to 100 μm.

Thereafter, as shown in FIG. 5B, a portion of the ceramic green sheet 1 is punched to form via holes 11. Each via hole 11 may be placed in a position corresponding to that of the interlayer circuit exposed through the surfaces of the first and second ceramic blocks 100 and 200 of FIG. 3A s so that the interlayer circuit can be connected thereto. As shown in FIG. 5C, the via holes 11 are filled with conductive paste to form conductive vias 12, thereby manufacturing the second bonding ceramic green sheet 10 placed between the first and second ceramic blocks 100 and 200 as shown in FIG. 3A.

The second bonding ceramic green sheet 10, placed between the first and second ceramic blocks 100 and 200, are illustrated in and described with reference to FIGS. 5A through 5C. However, the second bonding ceramic green sheets 20, 30 and 40 may be manufactured using the same method as illustrated in FIGS. 5A through 5C.

Figure 6A:
FIGS. 6A through 6C are views for explaining a method of manufacturing a second bonding ceramic green sheet illustrated in FIG. 4A.
Figure 6B:
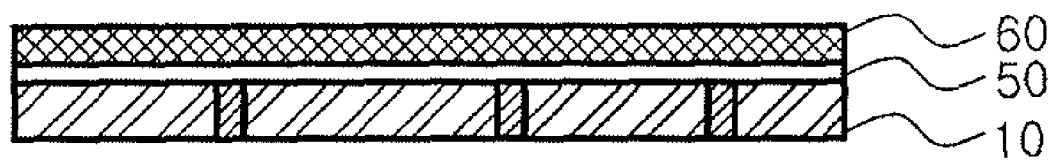
Figure 6C:
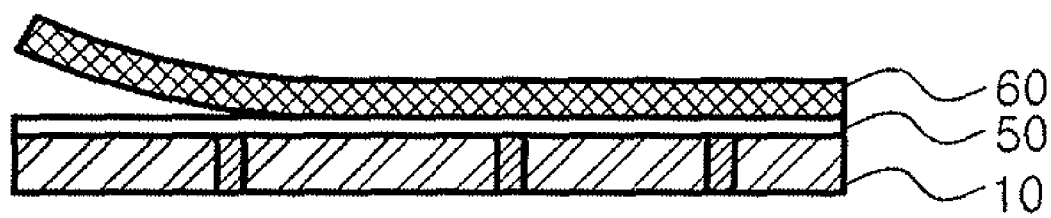

FIGS. 6A through 6C are views for explaining a method of manufacturing the second bonding ceramic green sheet illustrated in FIG. 4A. First, as shown in FIG. 6a, a binder solution, a mixture of a binder resin and a solvent, is cast on a support 60 such as a film, thereby forming the binder layer 50.

As shown in FIG. 6B, the resultant structure is disposed on the second bonding ceramic green sheet 10. In this case, the resultant structure may be disposed with the binder layer 50 bonded with the second bonding ceramic green sheet 10. The structure, disposed on the second bonding ceramic green sheet 10, is pressurized so that the binder layer 50 is uniformly attached to the second bonding ceramic green sheet 10.

Thereafter, as shown in FIG. 6C, the support 60 is removed from the binder layer 50, leaving the binder layer 50 on the second bonding ceramic green sheet 10. The binder layer 50 is formed on the other surface of the second bonding ceramic green sheet 10 using the method as described above.

Also, the binder layers 50 may be formed on other second bonding ceramic green sheets 20, 30 and 40 using the method illustrated in FIGS. 6A through 6C.

As set forth above, according to exemplary embodiments of the invention, the plurality of ceramic blocks, each with a thickness of 2 mm or less, are fired and then bonded together. Accordingly, the location precision of interlayer circuits in the multilayer ceramic substrate can be improved.

Also, the plurality of ceramic blocks are bonded using the binder layers and the bonding ceramic green sheets containing the glass components. Accordingly, the bonding force between the ceramic blocks can be enhanced.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of manufacturing a multilayer ceramic substrate, the method comprising:
    providing a plurality of ceramic blocks, each including a ceramic laminate having a first surface and a second surface and having a laminated structure of a plurality of ceramic green sheets containing a glass ceramic component, and a first bonding ceramic green sheet including a glass component and disposed on a surface of the first and second surfaces of the ceramic laminate, which is to contact another ceramic laminate;
    firing the plurality of ceramic blocks;
    laminating the plurality of fired ceramic blocks such that the first bonding ceramic green sheets of the adjacent ceramic blocks face each other; and
    bonding the plurality of ceramic blocks using the glass component of the first bonding ceramic green sheets.

2. The method of claim 1, wherein the bonding of the plurality of ceramic blocks comprises melting the glass component of the first bonding ceramic green sheet by heating the plurality of laminated ceramic blocks, to bond the plurality of ceramic blocks together.

3. The method of claim 1, wherein the glass ceramic component generates $CaAl_2Si_2O_8$, $SrAl_2Si_2O_8$, $BaAl_2Si_2O_8$ or $CaMgSi_2O_6$ when sintered.

4. The method of claim 1, wherein the glass component is $SiO_2$-based glass.

5. The method of claim 4, wherein the $SiO_2$-based glass comprises $SiO_2$—MgO—$Al_2O_3$, $SiO_2$—$Al_2O_3$, $SiO_2$—$Al_2O_3$—CaO, $SiO_2$—$Al_2O_3$—BaO, or $SiO_2$—CaO.

6. The method of claim 1, wherein the plurality of ceramic blocks each have a thickness of 2 mm or less.

7. The method of claim 1, wherein the firing of the plurality of ceramic blocks comprises:
   forming a constraining layer on at least one of opposing surfaces of each of the plurality of ceramic blocks;
   firing each ceramic block including the constraining layer; and
   removing the constraining layer from each ceramic block.

8. The method of claim 1, wherein the laminating of the plurality of fired ceramic blocks comprises laminating the plurality of fired ceramic blocks such that second bonding ceramic green sheets containing a glass component are placed between adjacent ceramic blocks of the plurality of fired ceramic blocks, respectively.

9. The method of claim 8, wherein the glass component of the first bonding ceramic green sheet and the glass component of the second bonding ceramic green sheet are the same material.

10. The method of claim 8, wherein the second bonding ceramic green sheets each have a thickness ranging from 30 μm to 100 μm.

11. The method of claim 8, wherein the plurality of ceramic blocks each comprises an interlayer circuit, and the second bonding ceramic green sheets each further comprises a conductive via to be connected with the interlayer circuit of the adjacent ceramic block.

12. The method of claim 8, wherein the second bonding ceramic green sheet further comprises a binder layer on a top surface and a bottom surface thereof, the binder layer including a binder resin and a solvent.

* * * * *